United States Patent
Chen et al.

(10) Patent No.: US 9,381,470 B2
(45) Date of Patent: Jul. 5, 2016

(54) COATING EQUIPMENT FOR A COMPOSITE MEMBRANE WITHOUT A DIFFUSION PUMP AND ITS THICKNESS GAUGE FOR BOTH THICK AND THIN COATINGS

(71) Applicant: Shanghai Honghao Enterprise Development CO., LTD, Shanghai (CN)

(72) Inventors: Shengfan Chen, Shanghai (CN); Xiandong Chen, Shanghai (CN); Yuna Jiang, Shanghai (CN); Shengzhen Chen, Shanghai (CN); Fajie Chen, Shanghai (CN)

(73) Assignee: Shanghai Honghao Enterprise Development CO., LTD, Shanghai (CN)

( * ) Notice: Subject to any disclaimer, the term of this patent is extended or adjusted under 35 U.S.C. 154(b) by 328 days.

(21) Appl. No.: 14/063,198

(22) Filed: Oct. 25, 2013

(65) Prior Publication Data

US 2015/0114289 A1    Apr. 30, 2015

(51) Int. Cl.

| | | |
|---|---|---|
| *B05C 11/02* | (2006.01) | |
| *B05C 1/00* | (2006.01) | |
| *B01D 69/12* | (2006.01) | |
| *C23C 14/56* | (2006.01) | |
| *F04C 18/00* | (2006.01) | |
| *C23C 14/24* | (2006.01) | |
| *C23C 14/52* | (2006.01) | |
| *B01D 67/00* | (2006.01) | |
| *F04C 23/00* | (2006.01) | |
| *F04C 25/02* | (2006.01) | |
| *F04C 29/00* | (2006.01) | |
| *F04C 18/12* | (2006.01) | |

(52) U.S. Cl.
CPC .............. *B01D 69/12* (2013.01); *B01D 67/00* (2013.01); *C23C 14/24* (2013.01); *C23C 14/52* (2013.01); *C23C 14/56* (2013.01); *C23C 14/562* (2013.01); *F04C 18/00* (2013.01); *F04C 18/126* (2013.01); *F04C 23/001* (2013.01); *F04C 25/02* (2013.01); *F04C 29/0085* (2013.01)

(58) Field of Classification Search
None
See application file for complete search history.

(56) References Cited

U.S. PATENT DOCUMENTS

| | | | | |
|---|---|---|---|---|
| 2,937,807 | A * | 5/1960 | Lorenz | F04C 29/005 417/247 |
| 2,940,661 | A * | 6/1960 | Lorenz | F04C 18/126 417/338 |
| 3,966,325 | A * | 6/1976 | Mohler | H01S 3/0014 356/218 |
| 4,617,864 | A * | 10/1986 | Niedermaier | B41F 13/22 101/219 |
| 4,900,999 | A * | 2/1990 | Shibata | G05B 19/416 141/1 |
| 5,438,415 | A * | 8/1995 | Kazama | G01B 11/065 356/367 |
| 2003/0228415 | A1 * | 12/2003 | Bi | C23C 16/402 427/180 |
| 2004/0255804 | A1 * | 12/2004 | Hoffmann | B41F 13/22 101/375 |

(Continued)

OTHER PUBLICATIONS

Inventor Search in Espacenet.*

*Primary Examiner* — Charles Capozzi

(57) ABSTRACT

A coating equipment for composite membrane without diffusion pump and its thickness gauge for both thick and thin coatings comprises a coating equipment for composite membrane without diffusion pump and a thickness gauge for both thick and thin coatings. A vacuum pump system of the coating equipment for composite membrane without diffusion pump is a roots-type pump system. Compared to conventional diffusion pumps, roots-type pump have advantages of low energy consumption, stable performance, good vacuum-pumping effect, short starting time, etc.

2 Claims, 5 Drawing Sheets

(56) References Cited

U.S. PATENT DOCUMENTS

| | | | | |
|---|---|---|---|---|
| 2004/0261709 A1* | 12/2004 | Sakata | ............... | C23C 14/243 118/718 |
| 2008/0170952 A1* | 7/2008 | Jung | ............... | H02K 3/02 417/423.7 |
| 2008/0237390 A1* | 10/2008 | Okizaki | ............... | B65H 27/00 242/615.2 |
| 2009/0320747 A1* | 12/2009 | Hayashi | ............... | B05C 1/0821 118/50 |
| 2011/0268893 A1* | 11/2011 | Honda | ............... | C23C 14/24 427/596 |

* cited by examiner

COATING EQUIPMENT FOR A COMPOSITE MEMBRANE WITHOUT A DIFFUSION PUMP AND ITS THICKNESS GAUGE FOR BOTH THICK AND THIN COATINGS

BACKGROUND OF THE PRESENT INVENTION

1. Field of Invention

The present invention relates to coating technology.

2. Description of Related Arts

At least three rotating parts, i.e., a feed roller, a cooling roller, and a spreading roller which must cooperate to work accurately are necessary in coating process. Since the matrix membrane is very thin and weak, if the three rotating parts make mistakes on the feed rates, the matrix membrane will be torn easily. It is very difficult to accurately control the feed rates of the three rotating parts to completely synchronize with each other. Complicated mechanical structures and automation system are required to synchronize the feed rates, which causes increasing of the cost.

In addition, in the conventional vacuum coating equipment, the vacuum pump is ordinarily diffusion pump. The diffusion pump has disadvantages of high energy consumption, long starting time, low vacuum degree, etc. The energy consumption of the diffusion pump accounts for a large part of the energy consumption of the whole vacuum coating equipment.

SUMMARY OF THE PRESENT INVENTION

An object of the present invention is to provide a coating equipment for composite membrane without diffusion pump and its thickness gauge for both thick and thin coatings therefor to solve the above technical problems.

The technical solutions of the present invention to solve the technical problems are as follows.

A coating equipment for composite membrane without diffusion pump and its thickness gauge for both thick and thin coatings comprises a coating equipment for composite membrane without diffusion pump, wherein the coating equipment for composite membrane without diffusion pump comprises a vacuum-pumping system and a coating chamber, the vacuum-pumping system is connected with the coating chamber for vacuumizing the coating chamber, the vacuum-pumping system comprises a vacuum pump system provided therein, and the vacuum pump system is embodied as a roots-type pump system.

Compared to conventional diffusion pumps, the roots-type pump has advantages of low energy consumption, stable performance, good vacuum-pumping effect, short starting time, etc., which help to increase stability of performance of the whole coating equipment for composite membrane without diffusion pump and its thickness gauge for both thick and thin coatings, improve quality of coatings, and significantly reduce energy consumption.

The roots-type pump system is embodied as a high vacuum multi-level roots-type pump system, wherein the high vacuum multi-level roots-type pump system comprises at least two roots-type pumps which are connected step by step.

The roots-type pump comprises a roots-type pump body, wherein the roots-type pump body has an air inlet and an air outlet, the roots-type pump body has a roots-type pump chamber, a base is provided in a bottom portion of the roots-type pump chamber, the air inlet and the air outlet are respectively provided at two sides of the roots-type pump chamber.

The roots-type pump body further comprises a motor for providing power, wherein the motor comprises a motor housing having a structure of seal chamber, and the motor housing is communicated to the roots-type pump chamber.

The motor is embodied as a water-cooled vacuum seal motor, comprising a rotor and a stator, wherein a stator coil formed by winding a wire is provided on the stator, and a plastic sleeve coats the wire. The plastic sleeve seals the wire, in such a manner that the wire is insulated from outside, to avoid the risk of short circuit and motor burning due to ionized ions or conducting particles.

The water-cooled vacuum seal motor further comprises a water-cooled system, wherein the water-cooled system comprises a water-cycling system and a driving system for driving the water-cycling system, the water-cycling system comprises a radiating pipe, winding around the stator.

The radiating pipe absorbs heat of the stator to prevent overheating of the stator caused by difficulty of radiating, and to further prevent damage and overburning of the equipment.

An evaporation box system having an adjustable height is provided in the coating chamber, wherein an evaporation box used as an evaporation source is provided in the evaporation box system, the evaporation box is provided on an evaporation box holder, and the evaporation box is connected with the evaporation box holder via a lifting mechanism.

In the above design, a height of the evaporation box is adjusted by the lifting mechanism, in such manner that thickness and uniformity of a coating can be adjusted. Compared to conventional equipments comprising a conventional structure, the equipment in the present invention produces more variety of products.

A feed roller, a cooling roller, and a spreading roller are provided in the coating chamber, wherein the spreading roller is embodied as a sliding-type spreading roller, comprising a spreading roller body connected with an axle, the spreading roller body comprises a roller drum which is cylinderical, and a roller core which is tubular, the roller drum coats the roller core, the roller drum is connected with the roller core slidably, and the axle is connected with the roller core.

The roller drum coats the roller core, and damping oil is added between the roller drum and the roller core for damping effect.

The cooling roller is embodied as a telescopic cooling roller, which comprises a roller drum, and a cooling roller core, wherein the roller drum coats the cooling roller core, the roller drum is cylindrical, and the cooling roller core is tubular. The roller drum coats the roller core.

The telescopic cooling roller further comprises a cooling liquid conveying tube, which winds around the cooling roller core in a shape of spiral.

At least two evaporators are arranged on the evaporation box. The evaporation box has a cuboid chamber provided in an upper portion thereof. The evaporators have rectangular openings.

The evaporators are arranged in the cuboid chamber of the evaporation box bias and parallelly.

In conventional technology, the evaporators are arranged in a direction same as a width of the cuboid chamber, which causes a low utilization rate of metallic vapor. The present invention solves the problem by the above technical solution.

The spreading roller is embodied as a heat-expansion type aluminium alloy guide roller, which comprises an aluminium alloy guide roller body, an iron layer adhering to the aluminium alloy guide roller body, and a hard metal layer coating the iron layer. The hard metal is embodied as a nickel layer, or a titanium layer.

The coating equipment for composite membrane without diffusion pump and its thickness gauge for both thick and thin coatings further comprises a thickness gauge for both thick and thin coatings. The thickness gauge for both thick and thin coatings comprises an equipment holder, and a light detector fixed on the equipment holder and connected with a micro-processor system, wherein the light detector comprises a light source which is embodied as an infrared laser.

The light detector further comprises a light sensor which is embodied as an infrared photosensitive diode.

The equipment holder has a gap. The infrared laser and the infrared photosensitive diode are respectively provided at two sides of the gap, and opposite to each other.

The infrared laser is connected with a power source via a power adjuster, and the infrared laser adjusts light intensity via the power adjuster.

The power adjuster comprises two current-limiting resistors, which are respectively connected with the infrared laser via a selective switch. The selective switch selects one of the current-limiting resistors to electrically connect with the infrared laser. Experiments show that the present invention is applicable for a band of 1-60 nm or a band of 1-20 nm.

The infrared laser has a luminescence band of 860 nm-960 nm.

The infrared photosensitive diode has a sensitive band of 860 nm-960 nm. Infrared having a band of 860 nm-960 nm is hardly found in natural, so natural light can hardly disturb the equipment.

The light detector comprises an oscillator signal transmitting module connected with the infrared laser via the power adjuster, in such a manner that the infrared laser alternates between luminescence and extinguishing, i.e., the infrared laser flickers. An AD converter is connected with the infrared photosensitive diode, and the infrared photosensitive diode is connected with the micro-processor system via the AD converter. The micro-processor system records values transmitted by the AD converter. As the infrared laser flickers, the AD converter transmits alternating values. The micro-processor system calculates a difference between the alternating values transmitted by the AD converter, and the difference indicates a value of the thickness, which effectively eliminates error caused by disturbance of natural light.

The light detector further comprises a frequency-selecting module matching with the oscillator signal transmitting module. The frequency-selecting module is connected with the infrared photosensitive diode. The infrared laser flickers by loading an oscillation frequency, in such a manner that external disturbance is effectively reduced, and detecting accuracy is improved.

A human-computer interaction mechanism and a monitor are connected with the micro-processor system. The human-computer interaction mechanism is embodied as a keyboard or a touch screen. The micro-processor system is connected with a controlling terminal of the power adjuster. A user controls the micro-processor system by the human-computer interaction mechanism, to control the power adjuster, and further control a transmitting power of the infrared laser.

At least eight light detectors are mounted on the equipment holder, and the light detectors are arranged along the gap.

Distances between the light detectors are less than 8 cm, in such a manner that the thicknesses at various positions of the coating are detected intensively.

A conveyor belt is provided between the coating chamber of the coating equipment for composite membrane without diffusion pump and the light detector of the thickness gauge for both thick and thin coatings. The thickness gauge for both thick and thin coatings is behind the coating equipment for composite membrane without diffusion pump along a direction of conveying.

Alternatively, the thickness gauge for both thick and thin coatings is provided in the coating chamber of the coating equipment for composite membrane without diffusion pump.

These and other objectives, features, and advantages of the present invention will become apparent from the following detailed description, the accompanying drawings, and the appended claims.

DETAILED DESCRIPTION OF THE PREFERRED EMBODIMENT

The present invention is further described as follows according the drawings, in such a manner that technical solutions creative characteristic and objects of the present invention are easy to understand.

Figure 1:
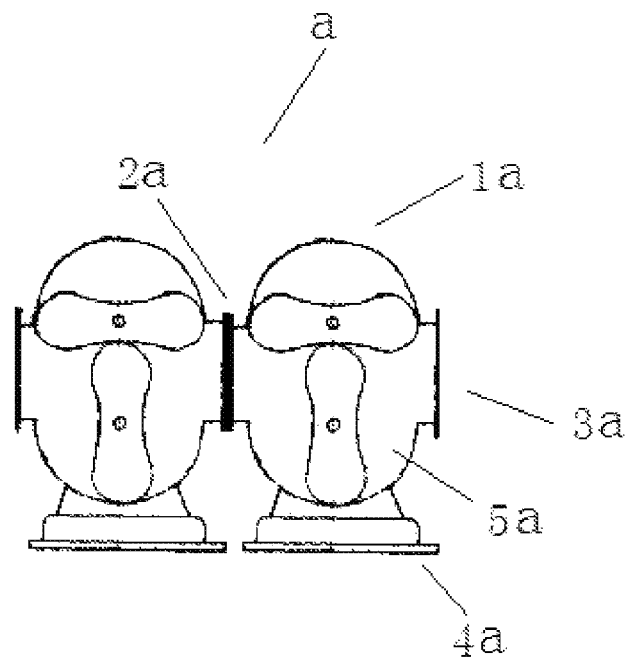
FIG. 1 is a structural sketch view of a high vacuum multi-level roots-type pump system.

Referring to FIG. 1, a coating equipment for composite membrane without diffusion pump and its thickness gauge for both thick and thin coatings comprises a coating equipment for composite membrane without diffusion pump, wherein the coating equipment for composite membrane without diffusion pump comprises a vacuum-pumping system and a coating chamber, the vacuum-pumping system is connected with the coating chamber for vacuumizing the coating chamber, the vacuum-pumping system comprises a vacuum pump system provided therein, and the vacuum pump system is embodied as a roots-type pump system.

The roots-type pump system is embodied as a high vacuum multi-level roots-type pump system a; wherein the high vacuum multi-level roots-type pump system a comprises at least two roots-type pumps a1, which are connected step by step; each of the roots-type pumps a1 comprises a roots-type pump body, which has an air inlet a2 and an air outlet a3, and comprises a roots-type pump chamber a5; a base a4 is provided under a bottom of the roots-type pump chamber a5; and the air inlet a2 and the air outlet a3 are respectively provided at two sides of the roots-type pump chamber a5.

Air inlets and air outlets of conventional roots-type pumps are respectively provided in upper portions and lower portions of the roots-type pumps. Since a height is limited, the roots-type pumps must be connected horizontally to form a high vacuum multi-level roots-type pump. Thus, a large number of connecting pipelines and elbow connectors are required to connect the roots-type pumps horizontally.

A locking male connector is provided at the air inlet a2, and a locking female connector matching with the locking male connector is provided at the air outlet a3.

The locking female connector provided at the air outlet a3 of the primary roots-type pump body is directly connected with the locking male connector provided at the air inlet a2 of the secondary roots-type pump body, in order to connect the roots-type pump bodies and further form the high vacuum multi-level roots-type pump system. A distance between the locking male connector and a bottom of the base a4 is equal to a distance between the locking female connector and the bottom of the base a4.

The roots-type pump body further comprises a motor for providing power, wherein the motor comprises a motor housing, having a structure of seal chamber, and the motor housing is communicated to the roots-type pump chamber a5.

Figure 2:
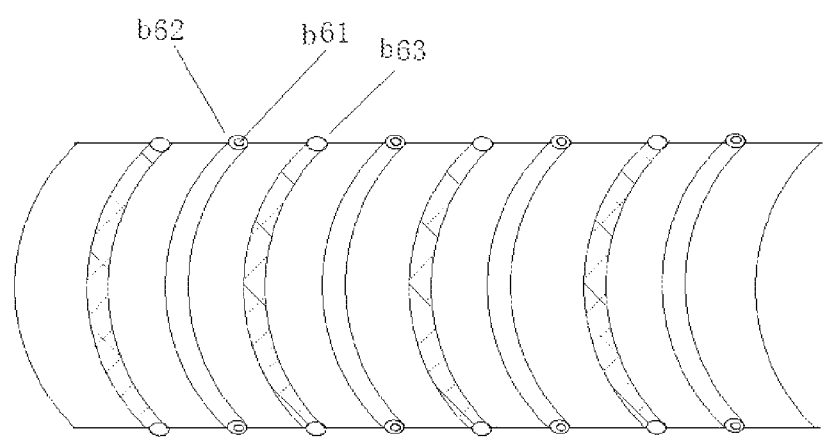
FIG. 2 is a section view of a stator of a water-cooled vacuum seal motor.

Referring to FIG. 2, the motor is embodied as a water-cooled vacuum seal motor, comprising a rotor and a stator, wherein a stator coil formed by winding a wire b61 is provided on the stator, and a plastic sleeve b62 coats the wire b61. The plastic sleeve b62 seals the wire b61, in such a manner that the wire b61 is insulated from outside, to avoid the risk of short circuit and motor burning due to ionized ions or conducting particles.

A rotor coil formed by winding a wire b61 is provided on the rotor, and a plastic sleeve b62 coats the wire b61.

Alternatively, the rotor is embodied as a permanent magnet rotor. Thus, the water-cooled vacuum seal motor has a structure of permanent magnet motor, in such a manner that the energy is saved, and the size is reduced.

The water-cooled vacuum seal motor further comprises a water-cooled system, wherein the water-cooled system comprises a water-cycling system and a driving system for driving the water-cycling system, the water-cycling system comprises a radiating pipe b63, winding around the stator, and the plastic sleeve b62 is embodied as a rubber sleeve.

Figure 3:
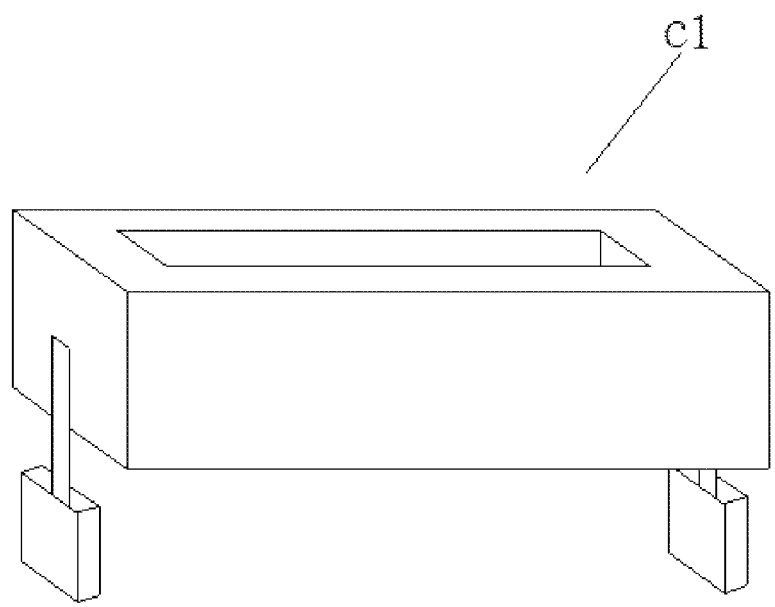
FIG. 3 is a perspective view of an evaporation box system having an adjustable height.

Referring to FIG. 3, an evaporation box system having an adjustable height is provided in the coating chamber, wherein an evaporation box c1 used as an evaporation source is provided in the evaporation box system, the evaporation box c1 is provided on an evaporation box holder, and the evaporation box c1 is connected with the evaporation box holder via a lifting mechanism.

The lifting mechanism is embodied as an electric lifting mechanism. The electric lifting mechanism comprises a lifting part connected with the evaporation box c1, wherein the lifting part is connected with a servo motor via a decelerating mechanism, a controlling terminal of the servo motor is connected with a controlling system, and the controlling system comprises a human-computer interaction mechanism.

The electric lifting mechanism further comprises a locating and locking mechanism, wherein the locating and locking mechanism comprises a locking part connected with an electrical moving mechanism, a controlling terminal of the electrical moving mechanism is connected with the controlling system, and is controlled by the controlling system.

Figure 4:
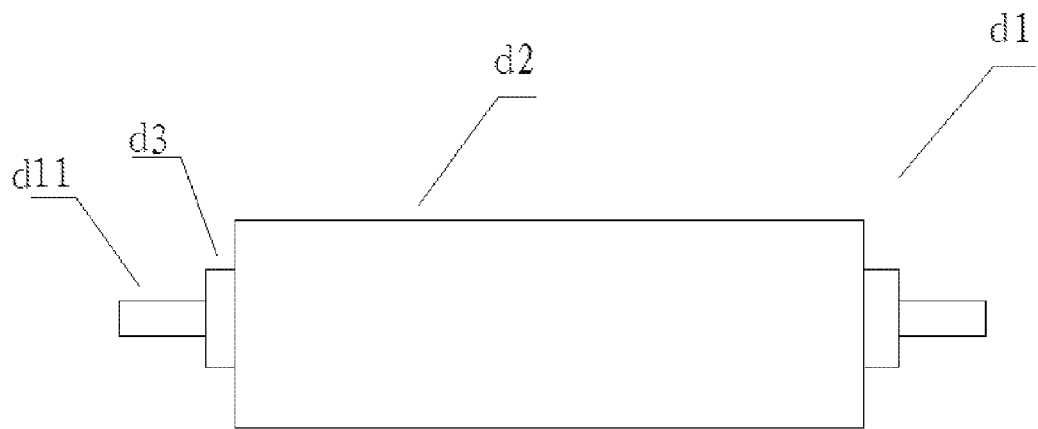
FIG. 4 is a front view of a sliding-type spreading roller.
Figure 5:
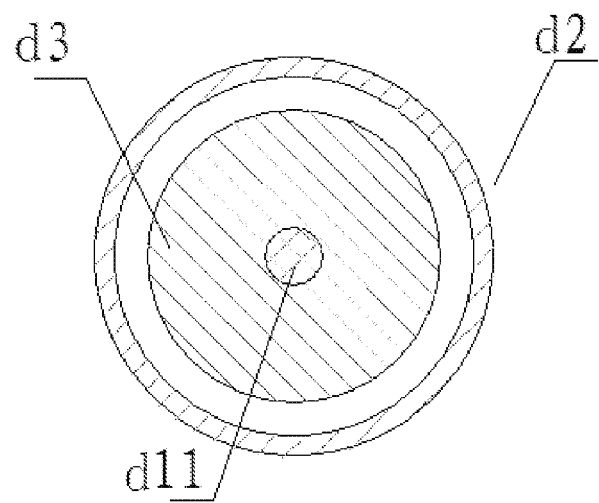
FIG. 5 is a side view of the sliding-type spreading roller.
Figure 6:
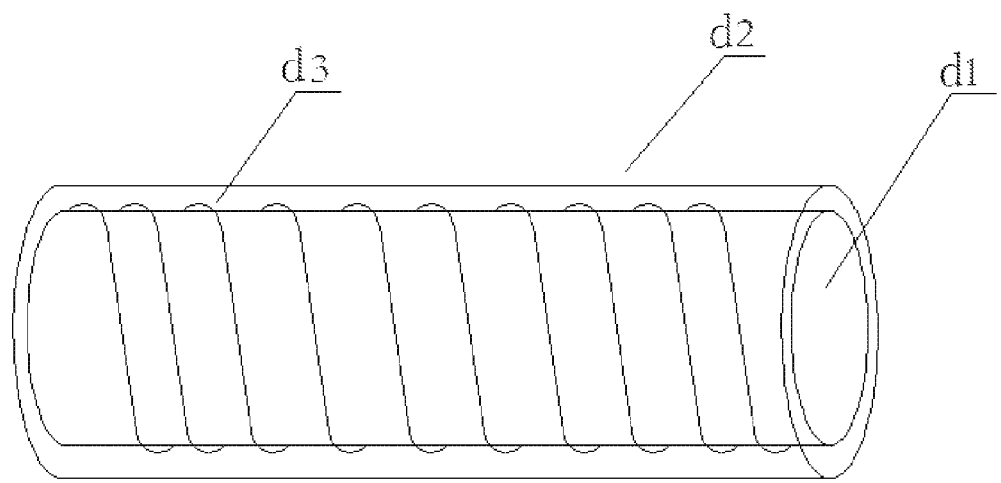
FIG. 6 is a sketch view of the sliding-type spreading roller, which shows inner structures of the sliding-type spreading roller.

Referring to FIG. 4~FIG. 6, a feed roller, a cooling roller, and a spreading roller are provided in the coating chamber, wherein the spreading roller is embodied as a sliding-type spreading roller, comprising a spreading roller body d1 connected with an axle d1, the spreading roller body d1 comprises a roller drum d2 which is cylinderical, and a roller core d3 which is tubular, the roller drum d2 coats the roller core d3, the roller drum d2 is connected with the roller core d3 slidably, and the axle d11 is connected with the roller core d3.

In the above design, the spreading roller body d1 comprises the roller drum d2 and the roller core d3, which are connected slidably. When the spreading roller does not match with other parts in feed rate, the roller drum d2 slides relative to the roller core d3 because of tension of matrix membrane. A relative sliding is generated to eliminate difference between the spreading roller and other parts in the speed rate, and further avoid risk that the matrix membrane is damaged by the tension.

The roller drum d2 coats the roller core d3, and damping oil is added between the roller drum d2 and the roller core d3 for damping effect. Alternatively, a damper is provided between the roller drum d2 and the roller core d3, and the roller drum d2 and the roller core d3 are connected by the damper. The damper is embodied as a bearing, wherein damping oil is added between balls and a bearing support of the bearing for damping effect.

The cooling roller is embodied as a telescopic cooling roller, which comprises a roller drum d2, and a cooling roller core, wherein the roller drum d2 coats the cooling roller core, the roller drum d2 is cylindrical, and the cooling roller core is tubular. The telescopic cooling roller further comprises a cooling liquid conveying tube, which winds around the cooling roller core in a shape of spiral.

The cooling liquid conveying tube is embodied as a metal bellows. Preferably the cooling liquid conveying tube is embodied as a steel metal bellows. The cooling liquid conveying tube is fixed outside the cooling roller core. The roller drum d2 coats the cooling liquid conveying tube, and is connected with the cooling roller core rotatably. The roller drum d2 rotates around the cooling roller core.

Alternatively, an axle is provided in the cooling roller core. The cooling roller core is fixedly connected with the roller drum d2, in such a manner that the telescopic cooling roller rotates around the axle.

Figure 7:
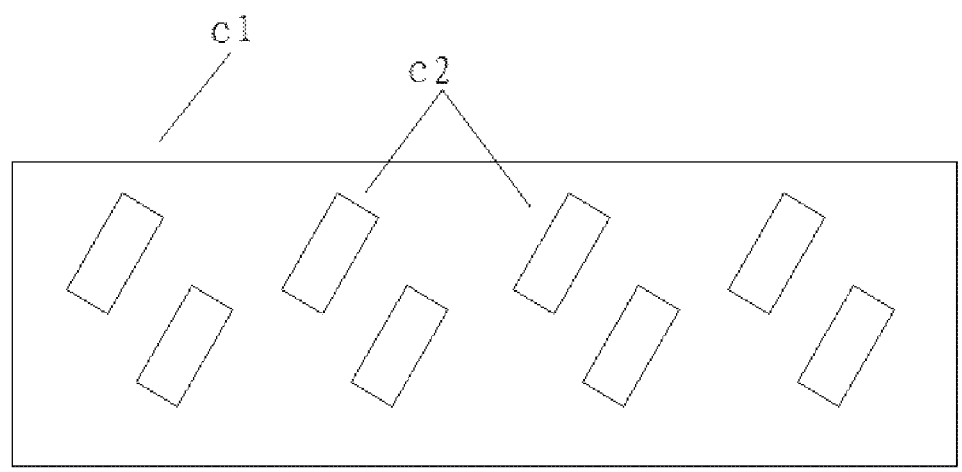
FIG. 7 is a sketch view showing arrangement of evaporators.
Figure 8:
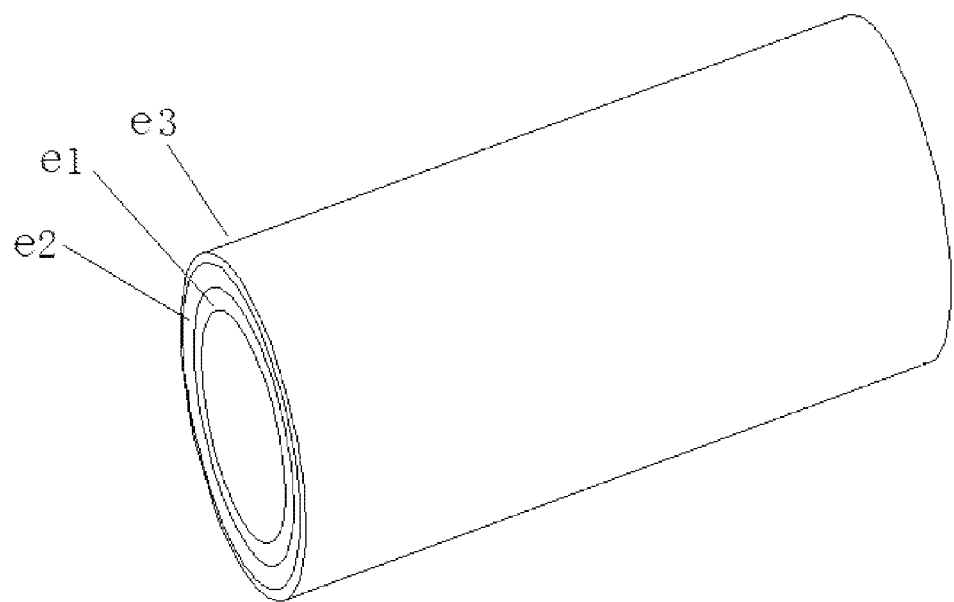
FIG. 8 is a perspective view of a heat-expansion type aluminium alloy guide roller.

Referring to FIG. 7, at least two evaporators c2 are arranged on the evaporation box c1. The evaporation box c1 has a cuboid chamber provided in an upper portion thereof. The evaporators c2 have rectangular openings. The evaporators c2 are arranged in the cuboid chamber of the evaporation box c1 in parallel.

The evaporators c2 are arranged in two rows. A first row is close to a left side of the cuboid chamber, and a second row is close to a right side of the cuboid chamber. The evaporators c2 in the two rows are arranged in a staggered way to prevent local overheating of coatings. At least two wire feeders are provided outside the evaporation box c1, and at least one guide bracket is provided inside the evaporation box c1. The guide bracket comprises a wire inlet and a wire outlet. The wire outlet is provided towards the evaporators c2.

Figure 9:
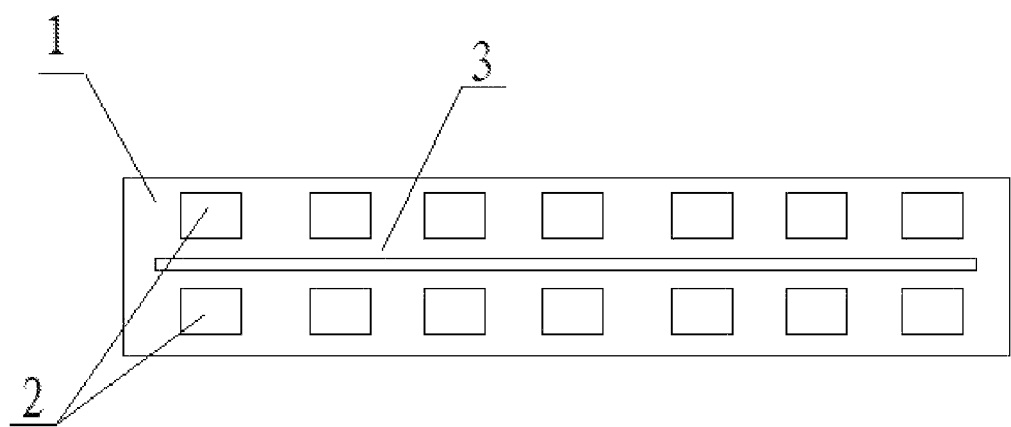
FIG. 9 is a structural sketch view of a thickness gauge for both thick and thin coatings.

The coating equipment for composite membrane without diffusion pump and its thickness gauge for both thick and thin coatings further comprises a thickness gauge for both thick and thin coatings. Referring to FIG. 9, the thickness gauge for both thick and thin coatings comprises an equipment holder 1, and a light detector 2 fixed on the equipment holder 1 and connected with a micro-processor system, wherein the light detector 2 comprises a light source which is embodied as an infrared laser, and a light sensor which is embodied as an infrared photosensitive diode; the equipment holder 1 has a gap 3; the infrared laser and the infrared photosensitive diode are respectively provided at two sides of the gap 3, and opposite to each other; the infrared laser is connected with a power source via a power adjuster; and the infrared laser adjusts light intensity via the power adjuster.

A coated membrane required to be detected is displaced in the gap 3. The light detector 2 is started to detect a light intensity of transmitted light, and then the light detector 2 transmit data detected to the micro-processor system. Thickness of the coating is obtained by analyzing the data.

The power adjuster comprises two current-limiting resistors, which are respectively connected with the infrared laser via a selective switch. The selective switch selects one of the current-limiting resistors to electrically connect with the infrared laser. Experiments show that the present invention is applicable for a band of 1-60 nm or a band of 1-20 nm.

The infrared laser has a luminescence band of 860 nm-960 nm, and the infrared photosensitive diode has a sensitive band of 860 nm-960 nm. Infrared having a band of 860 nm-960 nm is hardly found in natural, so natural light can hardly disturb the equipment.

At least eight light detectors 2 are mounted on the equipment holder 1, and the light detectors 2 are arranged along the gap 3. Distances between the light detectors 2 are less than 8 cm, in such a manner that the thicknesses at various positions of the coating are detected intensively.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. Coating equipment for a composite membrane without a diffusion pump, comprising: a vacuum-pumping system and a coating chamber, wherein said vacuum-pumping system is connected with said coating chamber for vacuumizing said coating chamber, said vacuum-pumping system comprises a vacuum pump system provided therein, and said vacuum pump system is a roots-type pump system;

wherein an evaporation box system having an adjustable height is provided in said coating chamber, an evaporation box used as an evaporation source is provided in said evaporation box system, said evaporation box is provided on an evaporation box holder, and said evaporation box is connected with said evaporation box holder via a lifting mechanism;

wherein said lifting mechanism is an electric lifting mechanism, said electric lifting mechanism comprises a lifting arm connected to said evaporation box, wherein said lifting arm is connected to and driven by a servo motor, while a controlling terminal of said servo motor is connected to and controlled by a computer;

wherein at least two evaporators are arranged on said evaporation box, said evaporation box has a cuboid chamber provided in an upper portion thereof, said evaporators have rectangular openings, and said evaporators are arranged in said cuboid chamber of said evaporation box in parallel.

2. Coating equipment for a composite membrane without a diffusion pump, comprising: a vacuum-pumping system and a coating chamber, wherein said vacuum-pumping system is connected with said coating chamber for vacuumizing said coating chamber, said vacuum-pumping system comprises a vacuum pump system provided therein, and said vacuum pump system is a roots-type pump system;

wherein an evaporation box system having an adjustable height is provided in said coating chamber, an evaporation box used as an evaporation source is provided in said evaporation box system, said evaporation box is provided on an evaporation box holder, and said evaporation box is connected with said evaporation box holder via a lifting mechanism;

wherein said lifting mechanism is an electric lifting mechanism, said electric lifting mechanism comprises a lifting arm connected to said evaporation box, wherein said lifting arm is connected to and driven by a servo motor, while a controlling terminal of said servo motor is connected to and controlled by a computer;

wherein the coating equipment further comprises a thickness gauge for coatings, which comprises an equipment holder, and a light detector fixed on said equipment holder and connected with a micro-processor system, wherein said light detector comprises a light source which is an infrared laser, said light detector further comprises a light sensor which is an infrared photosensitive diode, said equipment holder has a gap, said infrared laser and said infrared photosensitive diode are respectively provided at two sides of said gap, and opposite to each other, said infrared laser is connected with a power source via a power adjuster, and said infrared laser adjusts light intensity via said power adjuster;

wherein at least eight light detectors are mounted on said equipment holder, and said light detectors are arranged along said gap;

wherein a conveyor belt is provided between said coating chamber of said coating equipment for the composite membrane without the diffusion pump and said light detectors of said thickness gauge for coatings, said thickness gauge for coatings is behind said coating equipment for the composite membrane without the diffusion pump.

* * * * *